US008112882B2

(12) United States Patent
Baillin et al.

(10) Patent No.: US 8,112,882 B2

(45) Date of Patent: Feb. 14, 2012

(54) METHOD FOR PRODUCING A STRUCTURE

(75) Inventors: Xavier Baillin, Crolles (FR); Jean Brun, Champagnier (FR); Thierry Enot, Villard-Bonnot (FR); David Henry, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 522 days.

(21) Appl. No.: 12/285,623

(22) Filed: Oct. 9, 2008

(65) Prior Publication Data

US 2009/0094816 A1 Apr. 16, 2009

(30) Foreign Application Priority Data

Oct. 15, 2007 (FR) ..................................... 07 07213

(51) Int. Cl.
*H05K 3/30* (2006.01)

(52) U.S. Cl. ................ 29/832; 29/831; 29/841; 29/855; 29/861; 29/882; 359/290

(58) Field of Classification Search ................. 29/592.1, 29/831, 832, 841, 855, 861, 882; 359/290
See application file for complete search history.

(56) References Cited

U.S. PATENT DOCUMENTS

| | | | |
|---|---|---|---|
| 6,374,683 B1 * | 4/2002 | Hunicke-Smith et al. | 73/864.17 |
| 6,428,650 B1 | 8/2002 | Chung | |
| 6,589,625 B1 | 7/2003 | Kothari et al. | |
| 6,791,660 B1 | 9/2004 | Hayashi et al. | |
| 2001/0012088 A1 | 8/2001 | Jeong | |
| 2008/0136000 A1 | 6/2008 | Fischer et al. | |

FOREIGN PATENT DOCUMENTS

| | | |
|---|---|---|
| EP | 0 794 558 A1 | 9/1997 |
| WO | WO 2005/118463 A1 | 12/2005 |

OTHER PUBLICATIONS

Oberhammer et al.; "Selective Wafer-Level Adhesive Bonding with Benzocyclobutene for Fabrication of Cavities", *Sensors and Actuators A 105*, 2003, pp. 297-304.

* cited by examiner

*Primary Examiner* — Paul D Kim

(74) *Attorney, Agent, or Firm* — Oliff & Berridge, PLC

(57) ABSTRACT

A method for producing a structure includes bonding two substrates facing one another by crushing a closed peripheral sealing strip located between the two substrates, the closed peripheral sealing strip delineating a closed cavity between the substrates. A microsystem is disposed on one of the substrates within the closed cavity. Before crushing, the sealing strip includes perforated patterns delineating a plurality of voids inside the strip.

13 Claims, 2 Drawing Sheets

METHOD FOR PRODUCING A STRUCTURE

BACKGROUND OF THE INVENTION

The invention relates to a method for producing a structure comprising two facing substrates bonded to one another by crushing a closed peripheral sealing strip, the sealing strip delineating a closed cavity between the substrates.

The invention also relates to the structure obtained by this method.

STATE OF THE ART

Devices such as microsystems and for example Micro Electro Mechanical Systems (MEMS) or Micro Opto Electro Mechanical Systems (MOEMS), produced by means of microelectronics technologies, are objects which, on account of their size and fragility, have to be protected against external aggressions. This is why encapsulation of microsystems, in particular when the latter are still firmly secured to their initial substrate, represents an attractive solution for ease of handling and reducing costs.

Bonding a cover onto a substrate with a resin strip is conventional in the literature and is described in particular in the article by Oberhammer and al. "Selective wafer-level adhesive bonding with benzocyclobutene for fabrication of cavities", Sensors and Actuators A 105 (2003), 297-304.

Whereas in the microelectronics field, the patterns and design rules associated therewith are the subject of extensive studies, sealing strip designs do not take account of optimization of the chip surface or of the mechanical strength of the sealing strip. Furthermore, deformation of the seal is not taken into account in controlling the height of the cavity delineated by the seal or in optimizing the active surface of the chip. The use of a sealing strip presents the major drawback in mastering its final dimensions after crushing. In particular, it may overflow onto the active areas of the device and affect correct operation of the latter after sealing of the two substrates has been performed.

OBJECT OF THE INVENTION

One object of the invention is to overcome the shortcomings of known methods and more particularly to produce a structure wherein deformation of the sealing strip is better controlled, by a method that is easy to implement, to thereby achieve better control of the cavity size and enhanced adherence between the two substrates.

According to the invention, this object is achieved by the fact that, before crushing, the sealing strip comprises perforated patterns delineating a plurality of voids within the strip.

It is a further object of the invention to provide a structure obtained by this method.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF A PREFERRED EMBODIMENT OF THE INVENTION

Figure 1:
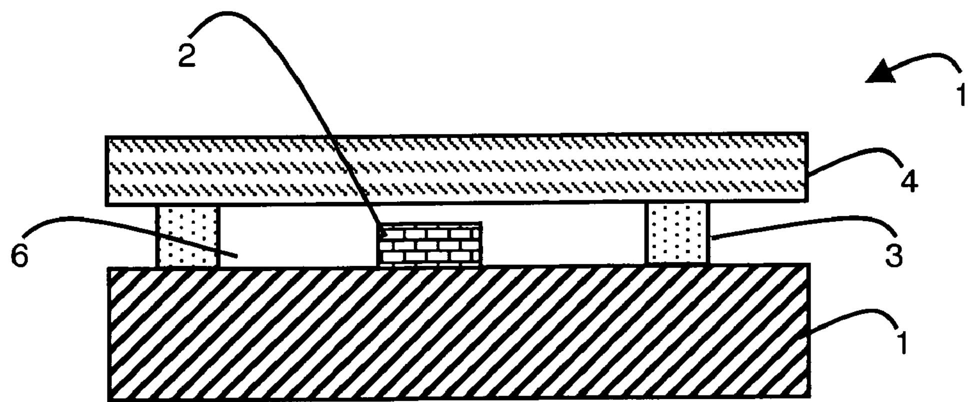
FIG. 1 represents a schematic cross-section view of a structure according to the prior art, FIG. 2 schematically represents a top view of a structure according to the invention, FIGS. 3 and 4 schematically represent bottom views of a portion of several embodiments of a sealing strip used in the method according to the invention, FIGS. 5 and 6 schematically represent top views of an example of strengthening areas according to the invention, FIG. 7 schematically represents a top view of a structure comprising two closed cavities according to the invention.
Figure 2:
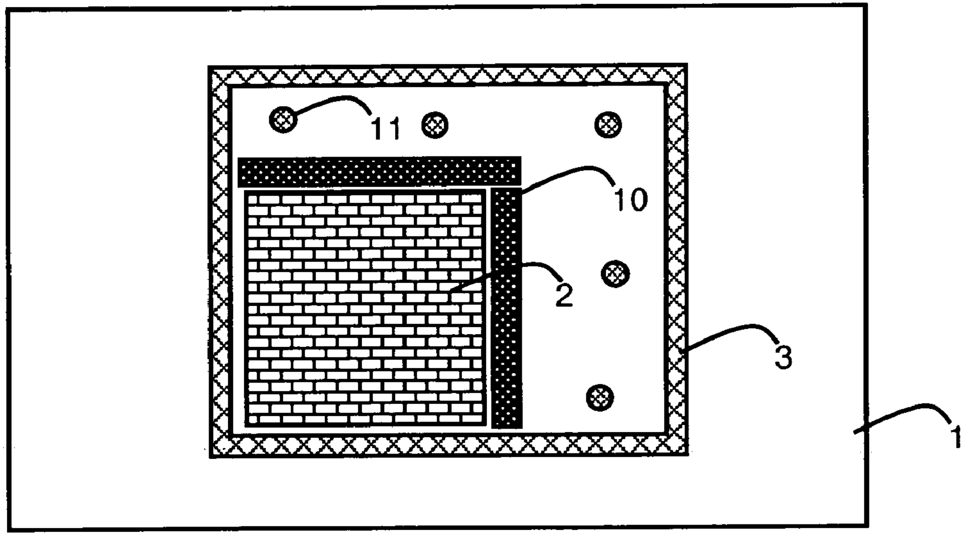

As illustrated in FIGS. 1 and 2, a first substrate 1 comprises a device, for example a microsystem 2 such as a Micro Electro Mechanical System (MEMS) or a Micro Opto Electro Mechanical System (MOEMS). The microsystem 2, produced in conventional manner, is securedly fixed to first substrate 1. It can be directly integrated on first substrate 1 which is then advantageously made of silicon, or secured to the latter after formation thereof. First substrate 1 can also be made of glass.

A closed peripheral sealing strip 3 is then formed on first substrate 1 around microsystem 2, in conventional manner. Sealing strip 3 is deposited by any suitable technique, for example by spin coating, and is then patterned by photolithography and etching by means of an additional photoresist or directly by exposure and development if strip 3 is made from a photosensitive and adhering material. Sealing strip 3 can also be patterned by screen printing, dispense or stamping. The height of strip 3 is advantageously comprised between 2 and 10 μm and its width is advantageously comprised between 100 and 300 μm.

As illustrated in FIG. 1, in conventional manner, a second substrate 4, that can be assimilated to a top substrate or a cover, is placed on sealing strip 3 facing substrate 1 and device 2. Sealing strip 3 is then crushed and the two substrates are bonded to one another. Bonding is preferably achieved by maintaining a stress that ensures a certain mechanical strength. Bonding can also be achieved in an chamber enabling control of the nature of the ambient atmosphere and the pressure in the closed cavity delineated by the two substrates 1, 4 and sealing strip 3 wherein microsystem 2 is disposed. The two substantially parallel substrates are then bonded by means of sealing strip 3. The cavity obtained is advantageously airtight or even hermetic and protects microsystem 2 from external aggressions.

Top substrate 4 can be made from silicon or advantageously from glass and be patterned such as to modulate the height of the cavity with respect to sealing strip 3. Bonding can be performed thermally and/or by exposure, for example by UltraViolet depending on the nature of the materials used.

To control deformation of sealing strip 3 when crushing of the latter is performed, at least before crushing, strip 3 presents perforated patterns 5 delineating a plurality of voids 6. Perforated patterns 5 of strip 3 can be assimilated to a bar perforated by voids 6, advantageously perpendicular to the substrate, for example with an axis of symmetry perpendicular to the substrate. In the particular embodiment of FIG. 3, preferred deformation areas are formed by holes 6 passing through the sealing strip over the whole height thereof and advantageously arranged at regular intervals along the sealing strip. However, the distribution of holes 6 can be modified according to the applications, in particular when the structure comprises access areas in at least one of substrates 1 and 4 and in immediate proximity to the sealing strip. Sealing strip 3 thus advantageously does not comprise any holes 6 near the access area, or only comprises very small holes. This precaution in particular enables weakening of these areas to be prevented.

If device 2 is of microelectronics type, the structure can be a microelectronic chip. The structure can however comprise any other type of device that has to be protected from the outside by a cavity.

Figure 3:
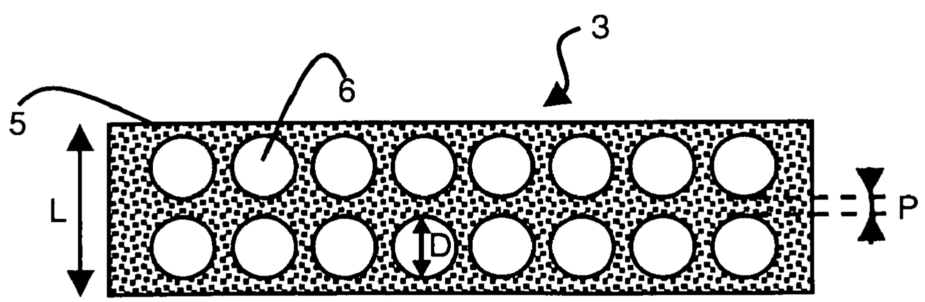

In the particular embodiment illustrated in FIG. 3, the sealing strip comprises two parallel rows of cylindrical holes 6.

Sealing strip 3 is therefore not as in the prior art a continuous, homogeneous and closed bead that surrounds microsystem 2, but a strip closed on itself and presenting voids. Perforated patterns 5 are contiguous and can present one or more series of holes that are preferably cylindrical, aligned or staggered. A strip closed on itself is a continuous or discontinuous strip that forms a closed loop, the discontinuities of the strip not being taken into account as they disappear after crushing.

Patterns 5 delineating a plurality of voids improve the propensity of strip 3 to crush compared with an uninterrupted solid strip. The contact surface and therefore the adherence between strip 3 and the two substrates 1 and 4 is thereby improved. Patterns 5 also enable deformation of strip 3 to be modulated and controlled when crushing of the latter takes place thereby controlling its final three-dimensional structure. This approach is of particular interest when a sealing strip has to be placed in immediate proximity to a microsystem and excessive deformation of the strip may impair correct operation of microsystem 2. This approach is particularly advantageous when the device presents moving parts, or any other area whose function is impaired by the presence of a resin in contact therewith. This embodiment is also interesting when the device has an optical function and the material constituting strip 3 is not transparent to the light rays associated with the optical device.

Figure 4:
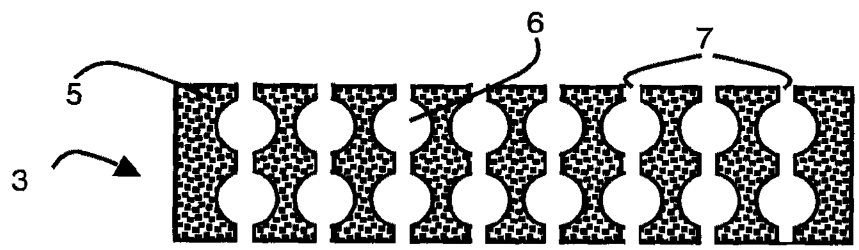

As illustrated in FIG. 4, perforated patterns 5 can form through voids 7 parallel to the substrate and perpendicularly to strip 3. Through voids 7 join the two side faces of the strip before crushing. Voids 6 are perforated in areas 7 that pass through the strip. The voids are for example formed by cylindrical holes 6 perpendicular to the substrate. Through voids (6, 7), that prevent tightness of the cavity being achieved before crushing takes place, close when the sealing strip is deformed by crushing to achieve tightness of the cavity. These through voids thereby enable better control of the pressure in the cavity just before the latter becomes airtight. In this way, it is easier to control the position of top substrate 4, particularly when a very small gap between microsystem 2 and top substrate 4 is sought for. In practice, lateral vents 7 are formed at the same time as the holes, for example by photolithography. They are then also formed over the whole height of the sealing strip, which can thus be discontinuous. A discontinuous sealing strip 3, before it is crushed, enables contact to be made easily between the atmosphere of the cavity and its outside environment. A discontinuous sealing strip 3 can enable degassing of the internal walls of the cavity before vents 7 are closed. A seal design as described in FIG. 4 combining vents 7 with voids 6 enables both the final dimensions of strip 3 to be controlled, but also the residual atmosphere in the cavity after sealing to be partially controlled.

Advantageously, in a plane parallel to the substrates, the design of the sealing strip 3 meets at least one of the following criteria:

The surface occupied by the perforated strip 3, i.e. the surface occupied by the resin, before crushing, is equal to or greater than about 5% of the surface of bottom substrate 1 supporting microsystem 2. Advantageously, this ratio is comprised between 10% and 20%.

The ratio between the surface of the voids and the total surface of the solid strip (without the voids) is comprised between 10% and 50%.

The ratio between the edge to edge spacing (D, FIG. 3) between two adjacent voids and the smallest lateral dimension of the void is less than 1 and preferably comprised between 0.5 and 0.8.

the width of vents 7 is smaller than the size of voids 6 (their diameter when they are of cylindrical shape) and preferably comprised between 20% and 50% of the latter.

Advantageously, perforated patterns 5 delineate voids that are preferably cylindrical and perpendicular to the substrates.

In the embodiment of FIG. 3, D being the diameter of each hole 6, the relation between the number K of voids (holes 6), the diameter D of these voids and the width L of strip 3 is given by: $L=K.D+(K+1).P$, P being the distance between 2 adjacent orifices.

An additional strip 10 can also be made inside the surface delineated by sealing strip 3 (FIG. 2). Additional strip 10 increases the contact surface between substrates 1, 4 and therefore the adhesion between the two substrates. In this way, the mechanical strength of the whole of the chip is increased. Indeed, if after thinning of one of substrates 1, 4, the latter is transformed into a flexible membrane, it is advantageous to place an additional strip 10 as close to the microsystem as possible to increase the mechanical strength around microsystem 2. Additional strip 10 can present perforated patterns 5 or not. Additional strip 10 can be formed at the same time as sealing strip 3 during the same technological step.

Additional strip 10 can surround microsystem 2 totally or partially and be formed, as in FIG. 2, on only one, two or three sides of the latter. In the case of an additional strip 10 that is not closed after sealing, the residual pressure is therefore identical in the whole volume defined by strip 3 and substrates 1 and 4.

Figure 5:
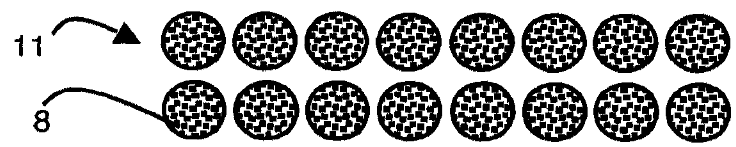
Figure 6:
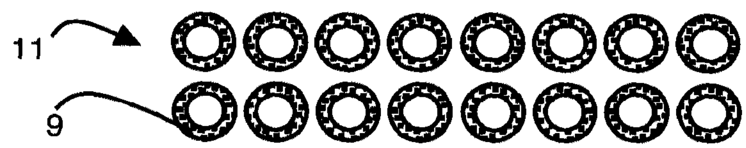

In the case where an additional strip 10 can not be easily achieved, strengtheners 11 are advantageously placed in the wafer at predetermined places between microsystem 2 and sealing strip 3 (FIG. 2). Strengtheners 11, which like additional strip 10 perform a mechanical function, advantageously have the form of solid pillars 8 or hollow pillars 9 (FIGS. 5 and 6). Advantageously, solid and hollow pillars (8, 9) and holes 6 have diameters of the same order of magnitude. Typically the diameter of solid pillars 8 is substantially equal to D whereas that of hollow pillars 9 is slightly larger than D.

If additional strips 10 and/or strengtheners 11 are used, the ratios of the resins defined hereabove can be distributed over several strips and/or strengtheners.

Advantageously, two additional strips 10 are made in the chip as close as possible to microsystem 2. However, more than three additional strips 10 can be envisaged. In the case where a plurality of strips 3, 10 are used, ranking of the strips can be performed. Sealing strip 3 thus controls crushing of the resin and thereby the gap between the two substrates 1 and 4, whereas additional strips 10 act only as adhesive strengtheners and are therefore preferably of smaller width than sealing strip 3.

If a plurality of chips having different sizes are to be encapsulated on the same initial substrate, the surface ratio between the resin and each chip can be standardized. The width of sealing strip 3 is fixed so as to obtain the required ratio on the smallest of the chips, and the same width L is preferably kept for all the chips. To keep the same resin/chip surface ratio for the chips presenting larger surfaces, the lack of resin is preferably compensated according to the geometry by adding one or more additional strips 10 and/or strengtheners 11.

Sealing strips 3 or additional strips 10 and strengtheners 11 can be fabricated in a single photolithography step, advantageously from the same photoresist. The photoresist can be chosen for example from negative BCB resins (benzocyclobutene, corresponding to the Cyclotene product from the 4000 series) marketed by Dow Chemical, SC Resist marketed by Fujifilm, or WPR marketed by JSR. For this type of adhesive, the sealing method generally consists in keeping the two substrates stressed while polymerizing the resin in temperature. The stress conditions applied to the substrates, the sealing temperature and time are proper to each product used. These conditions can be modified for each resin according to the application involved. For example, a sealing strip with a final thickness of about 6 μm can be made from BCB (Cyclotene 4024-40) by applying a stress of about one resolved megapascal (MPa) on the whole of the surface defined by the resin at 250° C. for one hour. Control of the thickness can thereby be achieved to within a few tenths of a micron. It is therefore not necessary to add mineral charges which would serve the purpose of acting as adjustment shim for the final thickness.

Sealing strips 3 or additional strips 10 and strengtheners 11 can also be fabricated by forming techniques of screen printing, dispense or stamping type if the material used is not photosensitive.

In the case where one of the two substrates is transparent to optic radiation, for example made of glass, and if strengtheners 11 or voids 6 of a perforated pattern 5 are symmetrical and preferably cylindrical, a first measurement of their diameter when definition thereof is performed and a second measurement after sealing of the two substrates 1, 4 has been performed enables their deformation to be controlled. By this method, the homogeneity of crushing of strip 3 when bonding is performed and therefore the quality of sealing can be checked. Pillars (8, 9) or a void 6 of a perforated pattern 5 of a strip (3, 10) can advantageously be used to perform easy optical checking, from outside, of their dimensional structure and therefore of the quality of crushing of sealing strip 3 at predetermined points of the chip. When two substrates 1, 4 are made of silicon, an identical dimensional control can be performed by means of an infrared microscope.

Figure 7:
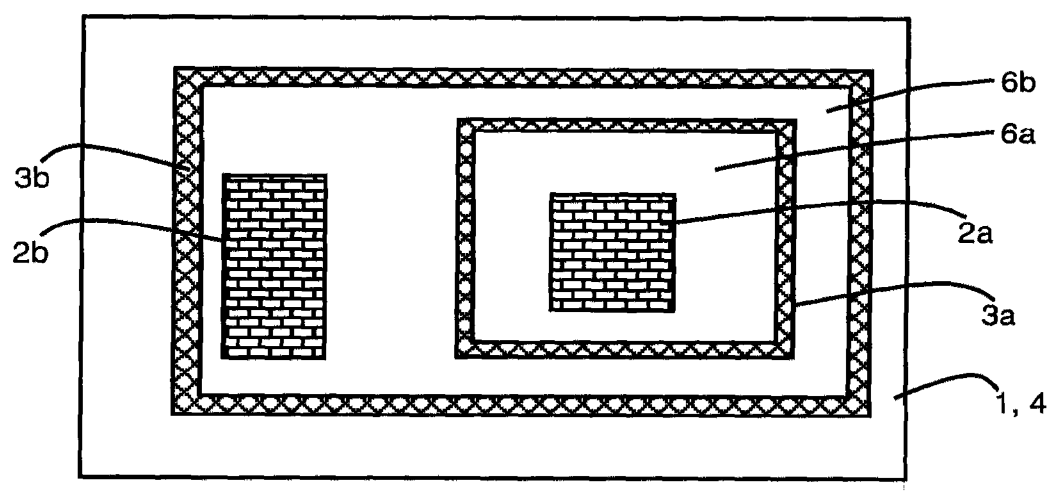

In another particular embodiment illustrated in FIG. 7, wherein the device comprises two parts referenced 2*a* and 2*b*, two closed cavities 6*a* and 6*b* can be achieved, each of the cavities comprising one of the parts of the device. Cavity 6*a* is disposed in cavity 6*b*. These two cavities can present different atmospheres and different controlled pressures. This can be obtained if for example sealing strip 3 comprises an inner strip 3*a* and an outer strip 3*b*. Outer strip 3*b* surrounds part 2*b* of the device and comprises vents or through voids 7. When the sealing cycle of the two substrates 1, 4 is performed, the latter can be brought into contact in a first gas G1 at a first pressure P1. By controlling the stress applied on substrates 1,4, it is possible to close inner cavity 6*a* defined by inner strip 3*a* and the two substrates 1, 4, in a first atmosphere (G1, P1), whereas outer strip 3*b* is not hermetic. Strip 3*a* is partially crushed whereas the vents of outer strip 3*b* are still partially open. It is then possible to fill outer cavity 6*b* containing part 2*b* of the device and delineated by inner strip 3*a*, outer strip 3*b* and the two substrates by a controlled atmosphere, a second gas G2, different or not from the first gas, under a second pressure P2. Increasing the stress applied on the two substrates then enables outer cavity 6*b* to be closed. The propensity to crushing of inner strip 3*a* is then greater than that of outer strip 3*b*, which can easily be obtained by adjusting the respective perforation ratios of the two strips. From the technological realization standpoint, it will be more interesting to use a single gas, for example nitrogen or argon.

For the sake of clarity, top substrate 4 is considered to be transparent in FIG. 7 and is represented with substrate 1.

The invention claimed is:

1. A method for producing a structure comprising:

forming a closed continuous ring around an active area on a first face of a first substrate, the closed continuous ring having a width defined by an inner face and an outer face opposed to the inner face and the closed continuous ring having a void located inside the closed continuous ring between the inner face and the outer face, the void being configured to extend through an entire height of the closed continuous ring;

providing a second substrate with a first face;

connecting the first face of the second substrate with the closed continuous ring so as to define a first cavity by the first face of the second substrate, the first face of the first substrate and the inner face of the closed continuous ring, the first face of the second substrate closing the void; and crushing the closed continuous ring by means of the first and second substrates so that the first cavity is an airtight cavity.

2. The method according to claim 1, wherein the void includes a plurality of voids in the closed continuous ring, a ratio between a total surface of the voids and a total surface of the closed continuous ring is comprised between 10% and 50% in a plane parallel to the first substrate.

3. The method according to claim 2, wherein a ratio between a spacing between an edge of two successive voids and a smallest dimension of the voids according to an axis connecting the inner face to the outer face is less than 1.

4. The method according to claim 1, wherein the closed continuous ring is formed by a strip of sealing material perforated by the void perpendicularly to the first substrate.

5. The method according to claim 1, wherein the void is cylindrical perpendicularly to the first substrate.

6. The method according to claim 3, wherein the ratio is comprised between 0.5 and 0.8.

7. The method according to claim 1, further comprising forming an additional strip on the first face at a location inside a location of the closed continuous ring, a width of the additional strip being smaller than the width of the closed continuous ring, the width of the additional strip being configured to increase bonding between the first and the second substrates without impacting deformation of the closed continuous ring.

8. The method according to claim 1, wherein the first substrate or the second substrate comprises an optically transparent area situated above the void, and the method further comprising measuring, via the optically transparent area, dimensions of the void after the connecting so as to control homogeneity of the crushing.

9. The method according to claim 7, wherein the closed continuous ring and the additional strip are made from a same material and in a same photolithography step.

10. The method according to claim 1, further comprising disposing a solid pillar having a diameter smaller than the width of the closed continuous ring, or disposing a hollow pillar, in the cavity on the first face of the first substrate.

11. The method according to claim 1, further comprising forming a microsystem on the active area of the first face of the first substrate before forming the closed continuous ring.

12. The method according to claim 11, wherein the active area is made of a silicon material.

13. The method according to claim 1, wherein the crushing fills the void so as to form a closed continuous ring devoid of the void.

* * * * *